United States Patent [19]
Borner et al.

[11] 4,054,851
[45] Oct. 18, 1977

[54] ACOUSTIC SURFACE-WAVE FILTER

[75] Inventors: Manfred Borner; Gerhard Kohlbacher, both of Ulm (Danube), Germany

[73] Assignee: Licentia Patent-Verwaltungs-G.m.b.H, Frankfurt am Main, Germany

[21] Appl. No.: 533,695

[22] Filed: Dec. 17, 1974

[30] Foreign Application Priority Data

Dec. 21, 1973 Germany ............................ 2363701

[51] Int. Cl.$^2$ ...................... H03H 9/02; H03H 9/26; H03H 9/30; H03H 9/32
[52] U.S. Cl. .................................... 333/72; 310/313; 330/5.5; 333/30 R
[58] Field of Search ................ 333/30 R, 72; 310/8.1, 310/8.3, 9.6, 9.7, 9.8; 331/107 A; 330 5.5;57

[56] References Cited

U.S. PATENT DOCUMENTS

| 3,568,102 | 3/1971 | Tseng | 333/30 R |
| 3,662,293 | 5/1972 | De Vries | 333/72 X |
| 3,781,717 | 12/1973 | Kuenemund | 333/72 X |
| 3,886,504 | 5/1975 | Hartmann et al. | 333/72 |

Primary Examiner—Alfred E. Smith
Assistant Examiner—Marvin Nussbaum
Attorney, Agent, or Firm—Spencer & Kaye

[57] ABSTRACT

An acoustic surface-wave filter comprises an element which is excitable to perform surface oscillations, which is formed at least partly of piezoelectric material and has interference locations for the surface wave on its surface together with electromechanical converter means, at least some of the interference locations forming a resonator with the average spacing of the interference locations being equal to a half of the wavelength of the surface waves or a whole number multiple of a half of the wavelength of the surface waves.

34 Claims, 9 Drawing Figures 4,054,851

ACOUSTIC SURFACE-WAVE FILTER

BACKGROUND OF THE INVENTION

The invention relates to an acoustic surface-wave filter comprising at least one element which can be excited to perform surface oscillations, which is made at least partly of piezoelectric material and the surface of which is provided, on at least one side thereof, with interference locations for surface waves, the filter also comprising means for converting electrical into mechanical energy and vice versa.

Acoustic surface-wave filters have a transmission behaviour such that, without increasing the dimensions of the transducer fingers, the attenuation frequency substantially follows the curve $(\sin x/x)^2$, where $x$ is a linear function of the frequency. This behaviour, with regard to the flank slope, is approximately the same as that of a three-circuit band-pass filter. There are known methods of influencing this transmission behaviour, either by increasing the dimensions of the transducer fingers or by constructing coupled resonance structures in the path of the surface wave, so that the filter flanks can be made steeper in a manner corresponding to a multi-circuit band-pass filter. The transducer fingers can be enlarged e.g. by varying the width or length of the electrodes, as is disclosed by the article "Akustische Oberflachenwellen-Filter" by R. F. Mitchell in "Philips techn. Rundschau," 32, 1971/72, Nos 6/7/8, pages 191-202. Varying the width of the electrodes has the advantage of reducing diffraction effects to a minimum. Its disadvantage is that an accurate photo-etching technique is required. Varying the length of the electrodes, on the other hand, requires less accuracy in the manufacture of the structures, but diffraction effects are stronger.

German Offenlegungsschrift 2,133,634, published Jan. 25th, 1973 describes coupled resonance structures which can also be used to improve the flank slope. These resonance structures comprise interference locations disposed perpendicular to the direction of propagation of the surface waves, the distance between adjacent interference points being selected so that a resonator is produced in conjunction with the intermediate portions of surface. Structures of this kind, however, also have to be manufactured very accurately since the accuracy with which the resonant frequency of a resonator can be adjusted depends of the accuracy with which two adjacent interference locations satisfy the condition $\lambda/2$.

When surface waves propagate, they are attenuated, due mainly to the properties of the piezoelectric material, the surface treatment and the electrodes. These losses, however, can be compensated or the surface waves can even be amplified by using a surface-wave semiconductor amplifier as described e.g. in the article "Surface Wave Delay Line Amplifiers" by Kenneth M. Lakin and H. J. Shaw in "IEEE Transactions on Microwave Theory and Technique," Vol. MTT-17, No. 11, November 1969, Pages 912-920. In this case, the amplifier is substantially either a piezoelectric semiconductive substrate connected to a source of voltage and inserted in the filter-element surface between the input and the output transducer, or a second element made of semiconductive material, connected to a source of voltage, and disposed at a short distance from the filter element made of piezoelectric material. However, the properties of the aforementioned surface-wave amplifiers are discussed only with reference to simple surface-wave filters which do not have any interference locations on the filter-element surface.

SUMMARY OF THE INVENTION

An object of the invention, therefore, is to provide a surface-wave filter which has a steep flank slope and can also be used for varying, within wide limits, the intensity of those oscillations which are transmitted through the filter.

According to a first aspect of the invention, there is provided an acoustic surface-wave filter comprising at least one element excitable to perform surface oscillations, at least partly of piezoelectric material and defining a surface, on at least one side thereof, with interference locations for surface waves, and means for converting electrical energy into mechanical energy and vice versa, characterised in that at least some of said interference locations are combined into a resonator in the form of a ruled grating and the average distance between said interference locations in said resonator is equal to half the wavelength of the surface waves or a whole-number multiple thereof.

According to a second aspect of the invention, there is provided an acoustic surface-wave filter comprising an element excitable to perform surface oscillations, at least partly formed of piezoelectric material and defining a surface on one side thereof, interference locations for said surface-wave on said surface defined by said element, means for converting electrical energy into mechanical energy and mechanical energy into electrical energy, and a resonator formed by at least some of said interference locations which have an average spacing equal to half the wavelength of the surface waves or a whole number multiple thereof.

BRIEF DESCRIPTION OF THE DRAWINGS

The invention will now be described in greater detail, by way of example, with reference to the drawings, in which.

DESCRIPTION OF THE PREFERRED EMBODIMENTS

In an acoustic surface-wave filter comprising at least one element which can be excited to perform surface oscillations, which is made at least partly of piezoelectric material and the surface of which is provided, on at least one side thereof, with interference locations for surface waves, the filter also comprising means for converting electrical into mechanical energy and vice versa the invention basically proposes that at least some of the interference locations are combined into a resonator in the form of a ruled grating and the average distance between the interference locations in the resonator is equal to half the wavelength of the surface waves or a whole-number multiple thereof.

The special advantage of the solution according to the invention is that, in contrast to the filter disclosed in German Offenlegungsschrift 2,133,634, the accuracy with which the resonant frequency can be adjusted does not depend on the accuracy with which two adjacent interferences locations satisfy the condition λ/2, but on the average accuracy with which the grating lines satisfy this condition. It is much easier, however, to adjust a ruled grating by varying the average than by varying each individual resonator, made up of two interference locations, as in the filter system disclosed in German Offenlegungsschrift 2,133,634.

Figure 1:
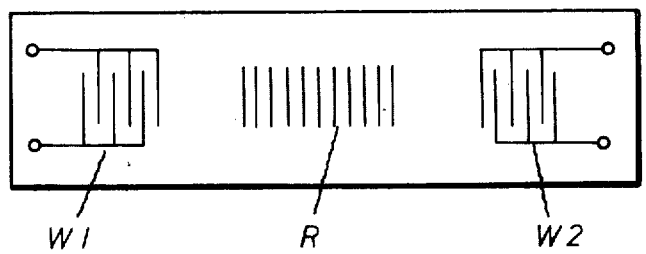
FIG. 1 is a schematic plan view of a simple filter in accordance with the invention.

Referring now to the drawings, FIG. 1 shows a filter according to the invention comprising a ruled, i.e., line, grating resonator R, an input electromechanical transducer W1 and an output electromechanical transducer W2 for respectively coupling and decoupling electrical energy. The transducers are constructed so that they can operate with very high efficiency and have a band width greater than the desired transmission band width. The ruled grating resonator, which is disposed in the path of the acoustic surface waves, is made up of a series of interference locations having dimensions which, compared with the wave length are large in the longitudinal direction of the grating lines and small in the transverse direction thereof.

The grating lines, i.e., the interference locations, can be constructed in a number of ways depending on the required accuracy and the distance between lines e.g. by photolithographic structuring of metal electrodes by sputter etching or chemcial etching i.e. by applying or removing material. The lines should provide very weak interference for the acoustic signal, so that a small percentage of the oscillation energy is reflected at each interference location. If the lines are disposed at intervals of λ/2 or a whole number multiple of the half wave-length corresponding to a frequency $f_o$, a standing wave is formed at the frequency $f_o$. At frequencies different from $f_o$, the grating produces strong interference and thus strongly attenuates the amplitude of oscillations. The sharpness of resonance, i.e. the quality of the resonator, increases with the number of grating lines. The frequency corresponding to the average difference between grating lines is also the resonant frequency of the resonator. A scatter in the distances between grating lines has an adverse effect on the resonance sharpness, and it is therefore advantageous for the difference between two interference locations in a resonator to be made approximately equal to half the wavelength of the surface waves or to a whole-number multiple thereof.

Figure 2:
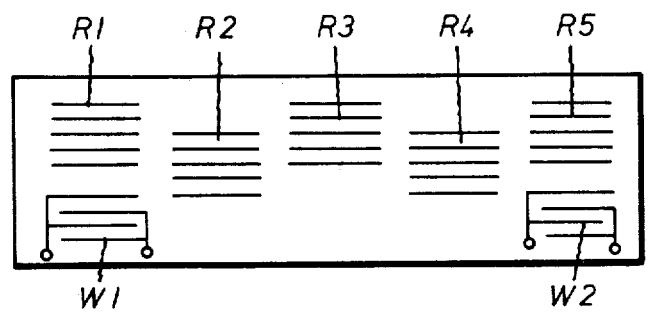
FIG. 2 is a schematic plan view of a second embodiment of the invention with a more complex form.
Figure 3:
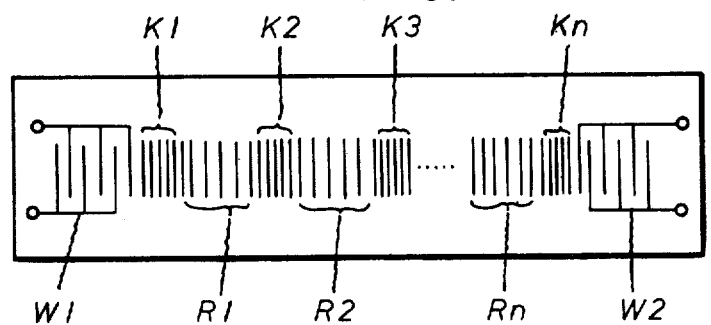
FIG. 3 is a schematic plan view of a third embodiment of the invention showning coupling elements between the resonators.
Figure 4:
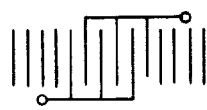
FIG. 4 is a schematic view showing a possible formation of an electromechanical transducer for a filter of the invention.
Figure 5:
FIG. 5 is a view showing schematically a staggered arrangement of lines for a resonator for a filter in accordance with the invention.

Alternatively, individual grating lines or groups thereof can be interconnected or, if the lines are made of metal coatings, the connected structures can be used as an electromechanical transducer (FIG. 4). The coupling between lines can also be influenced by the relative position thereof, e.g. by disposing the lines either one after the other as in FIG. 1 or in staggered relationship as in FIG. 5. A multi-circuit filter structure according to the invention can be obtained by a layout as in FIG. 2 or 3. In FIG. 2, the ruled gratings R1 to R5 are disposed so that part of the mechanical kinetic energy is decoupled from a resonator region and is used to excite a standing wave in the adjacent resonator. In FIG. 3, the resonator regions are enclosed in coupling regions Kl to Kn having distances between grating lines which are adjusted to a somewhat higher frequency than in the resonators, i.e. the distances between lines are somewhat smaller than in the resonators. The higher critical frequency of the coupling regions results in an energy intake similar to that in known monolithic filters, which substantially limits the mechanical energy of oscillation to the resonator region. A standing wave forms in the resonator region whereas a substantially exponential decrease in mechanical kinetic energy is observed away from the edge of the resonator region.

Figure 6:
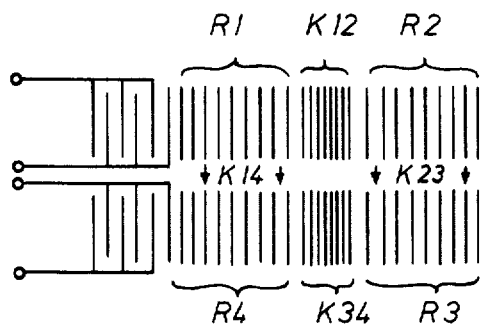
FIG. 6 is a view of the layout of a filter according to the invention for overcoupling.
Figure 7:
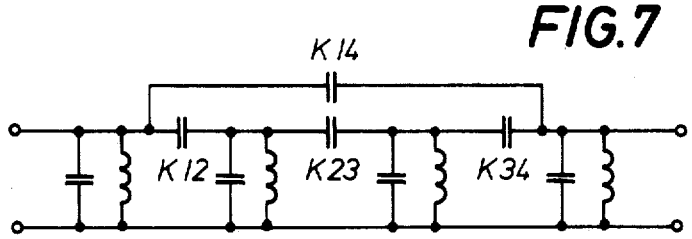
FIG. 7 is an equivalent circuit diagram of the layout shown in FIG. 6.

The coupling between two resonators can be varied either by varying the difference between the properties of the resonator region and the coupling region (the coupling decreases as the frequency difference increases) or by varying the width of the coupling regions, i.e. the distance between the resonator regions. For example, the coupling decreases with the increase in the distance between resonators or the angle between the grating lines in two adjacent resonators. The coupling is also affected by the surface quality of the coupling region or the difference between the wave impedance in the resonator region and the coupling region. In order to provide suitable limiting conditions, ruled gratings made of metal electrodes can be partly or entirely connected by electrical connections. If the resonators are suitably disposed, e.g. as in FIG. 6, overcoupling can also be provided between resonators which are not immediately adjacent, thus forming pole points in the filter transmission characteristic. FIG. 7 shows an equivalent circuit diagram which corresponds to the filter system in FIG. 6 and from which the coupling between individual resonators can be seen directly.

Figure 8:
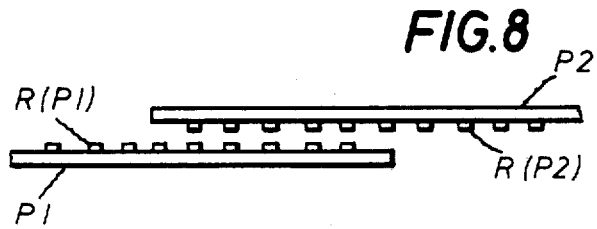
FIG. 8 shows how a coupling between resonators can be carried out via a piezoelectric field.

Alternatively, the coupling between two resonators R (P1) and R (P2) can be via a piezoelectric field as shown in FIG. 8. In FIG. 8 the electric field extends through the air gap into the resonator region R (P2) of a second piezoelectric plate (P2) disposed opposite the first plate (P1), where it likewise forms a standing wave. If Bleustein wavwes are generated, the air gap may alternatively be filled by a liquid. The resonator coupling is adjusted by varying the width of the gap, the dielectric constant ε of the gap medium, and the size of the overlap region. Consequently, the coupling between the resonators can be varied by moving the two plates relative to one another. Of course, overcoupling between non-adjacent resonators can also be provided in the same manner as in the system shown in FIG. 6, for the purpose of providing pole points or multi-circuit filters by incorporating ruled-grating resonators from plate P2 in the complete filter system.

Losses, due e.g. to the piezoelectric elements, the surface processing or the electrodes, occur in a surfacewave filter and may be compensated by surface-wave semiconductor amplifiers. These amplifiers may advantageously be used for compensating losses in surface-wave filters according to the invention in order to increase the Q factors of the resonators, or they may be inserted in the signal field at particular points only, in order to increase the amplitude of the mechanical vibration.

According to another advantageous feature of the invention, the rules grating structures may also be used in surface-wave semiconductor amplifiers. If, for example, the amplification factor in the semi-conductor is made periodic, a surface wave is selectively amplified at a signal frequency having a half wavelength which corresponds to the distance between periods. The technique of varying the periodicity of the amplifcation factor is to vary the doping of the semiconductor material, e.g. by ion implantation for high frequencies, i.e. for small distances between periods.

Figure 9:
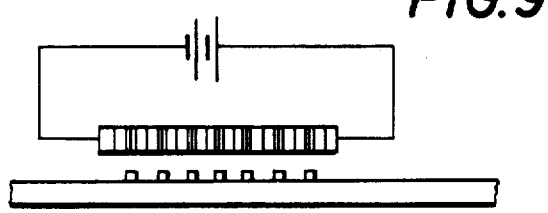
FIG. 9 shows the provision of a resonator and a surface-wave amplifier in separate media.

Finally, ruled grating resonators and semiconductor amplifiers having a periodic structure according to the invention can be combined into band pass filters have a very narrow band and very steep flanks. FIG. 9 shows a resonator and a surface-wave semiconductor amplifier having a separate medium. Alternatively, semiconductor amplifiers can be used with a combined medium, in which case the amplifier and the resonator form a unit.

It will be understood that the above description of the present invention is susceptible to various modifications changes and adaptations.

What is claimed is:

1. In an acoustic surface-wave filter comprising at least one element excitable to perform surface oscillations, at least partly of piezoelectric material and defining a surface, on at least one side thereof, with interference locations for surface waves, input transducer means for converting electrical energy into mechanical energy and output transducer means for converting mechanical energy into electrical energy, the improvement wherein at least some said interference locations are oireinted perpendicular to the original direction of propagation of an excited acoustic surface wave, are disposed between said input and output transducer means in the path of propagation of an excited acoustic surface-wave, and are combined into a resonator in the form of a ruled grating with the average distance between said interference locations in said resonator being equal to half the wavelength of the surface-waves or a whole-number multiple of a half of the wavelength of the surface-waves.

2. A surface-wave filter as defined in claim 1, wherein the distance between two said interference locations in a resonator is approximately equal to half the wavelength of the surface waves or a whole-number multiple of one half of the wavelength of the surface waves.

3. A surface-wave filter as defined in claim 1, wherein the dimensions of each of said interference locations of said grating, compared with the wavelength of the surface wave are large in the longitudinal direction and small in the transverse direction thereof.

4. A surface-wave filter as defined in claim 3 wherein said interference locations in said resonator are metal coatings on the surface.

5. A surface-wave filter as defined in claim 3 wherein said interference locations in said resonator are raised portions on the surface.

6. A surface-wave filter as defined in claim 3 wherein said interference locations in said resonator are recesses in the surface.

7. A surface-wave filter as defined in claim 3 wherein at least some of the said interference locations in said resonator are inter-connected.

8. A surface-wave filter as defined in claim 7, wherein at least some of the said interference locations in said resonator are combined to form an electromechanical transducer.

9. A surface-wave filter as defined in claim 1 wherein said interference locations are staggered parallel to the alignment of the lines of said grating.

10. A surface-wave filter as defined in claim 1 wherein the characteristic impedance of said surface wave in a resonator is different from the impedance in an adjacent region of said surface.

11. A surface-wave filter as defined in claim 10, wherein a surface region free from said interference locations is adjacent said resonator.

12. A surface-wave filter as defined in claim 10, and comprising a surface region provided with said interference locations adjacent said resonator with the average distances between said interference locations in said adjacent region being smaller than in said resonator.

13. A surface-wave filter as defined in claim 1 and comprising at least two said resonators whose coupling is defined by their mutual spacing.

14. A surface-wave filter as defined in claim 1 and comprising at least two said resonators whose coupling is defined by their alignment.

15. A surface-wave filter as defined in claim 1 and comprising at least two said resonators whose coupling is defined by the construction of the region between said two resonators.

16. A surface-wave filter as defined in claim 1 and comprising at least two said resonators disposed one behind the other with grating lines aligned parallel to one another.

17. A surface-wave filter as defined in claim 1, and comprising at least two said resonators disposed laterally side by side with grating lines aligned parallel to one another.

18. A surface-wave filter as defined in claim 17 wherein said resonators are staggered perpendicular to the alignment of said grating lines.

19. A surface-wave filter as defined in claim 1, and comprising at least two said resonators disposed one behind the other and a third said resonator disposed next to at least one of the said two resonators.

20. A surface-wave filter as defined in claim 19, wherein said third resonator is staggered relative to at least one of said two resonators.

21. A surface-wave filter as defined in claim 19 wherein at least two of said resonators are coupled directly and by way of a third said resonator in order to produce at least one pole point.

22. A surface-wave filter as defined in claim 1 and comprising at least one semi-conductor region contained in said surface provided with said interference locations, of said element which is made at least partly of piezoelectric material.

23. A surface-wave filter as defined in claim 1 and comprising an element containing at least one semiconductive region disposed at a small distance from said surface, provided with interference locations, of said element made at least partly of piezoelectric material.

24. A surface-wave filter as defined in claim 1 and comprising a second surface provided with at least one structure corresponding to the ruled grating of a resonator opposite the said surface provided with interference locations.

25. A surface-wave filter as defined in claim 24 and comprising a common element to which said first surface and said second surface belong.

26. A surface-wave filter as defined in claim 24 and comprising two separate elements to each of which one of said first surface and said second surface belong and which are separated by a small gap.

27. A surface-wave filter as defined in claim 26 and comprising air filling said small gap.

28. A surface-wave filter as defined in claim 26 and comprising a liquid filling said small gap.

29. A surface-wave filter as defined in claim 24 wherein said structure in said second surface comprises interference locations in the surface of an element made at least partly of piezoelectric material.

30. A surface-wave filter as defined in claim 24, wherein said structure in said second surface comprises differently doped regions in a surface of an element made at least partly of semiconductive material.

31. A surface-wave filter as defined in claim 24 wherein at least some of said interference locations in said first surface and at least one structure in said second surface overlap so as to produce interaction between said interference locations and said structure.

32. A surface-wave filter as defined in claim 31, and comprising at least two resonators in said first surface and at least one structure, overlapping said two resonators in said second surface.

33. A surface-wave filter as defined in claim 32 wherein at least two said resonators in said first surface are coupled both directly and through said structure in the said second surface in order to produce at least one pole point.

34. An acoustic surface-wave filter comprising an element excitable to perform surface oscillations, said element being at least partly formed of piezoelectric material and defining a surface on one side thereof; interference locations for surface-waves on said surface defined by said element, said interference locations each having dimensions in the direction of propagation of the surface-wave; input transducer means on said element for converting electrical energy into mechanical energy; output transducer means on said element for converting mechanical energy into electrical energy; and a resonator disposed between said input and output transducer means and in the direction of propagation of an excited acoustic surface wave, said resonator including a line grating formed by at least some of said interference locations which are oriented perpendicular to the original direction of propagation of an excited acoustic surface-wave and which have an average spacing equal to half the wavelength of the surface-waves or a whole number multiple of a half of the wavelength of the surface-waves.

* * * * *